United States Patent
Wake

(10) Patent No.: US 10,325,755 B2
(45) Date of Patent: Jun. 18, 2019

(54) CHARGED PARTICLE BEAM LITHOGRAPHY APPARATUS AND CHARGED PARTICLE BEAM LITHOGRAPHY METHOD

(71) Applicant: NUFLARE TECHNOLOGY, INC., Yokohama-shi (JP)

(72) Inventor: Seiji Wake, Numazu (JP)

(73) Assignee: NUFLARE TECHNOLOGY, INC., Yokohama-shi (JP)

( * ) Notice: Subject to any disclaimer, the term of this patent is extended or adjusted under 35 U.S.C. 154(b) by 0 days.

(21) Appl. No.: 15/864,335

(22) Filed: Jan. 8, 2018

(65) Prior Publication Data

US 2018/0197717 A1  Jul. 12, 2018

(30) Foreign Application Priority Data

Jan. 12, 2017 (JP) ................ 2017-003495

(51) Int. Cl.
*H01J 37/317* (2006.01)
*H01J 37/302* (2006.01)

(52) U.S. Cl.
CPC ...... *H01J 37/3174* (2013.01); *H01J 37/3026* (2013.01); *H01J 2237/31776* (2013.01)

(58) Field of Classification Search
CPC .. H01J 37/00; H01J 37/02; H01J 37/30; H01J 37/3002; H01J 37/3174; H01J 37/3175; H01J 37/3177
USPC .............. 250/492.2, 492.1, 492.22, 492.3
See application file for complete search history.

(56) References Cited

U.S. PATENT DOCUMENTS

| 8,907,278 B2 | 12/2014 | Enyama et al. | |
| 2003/0071231 A1* | 4/2003 | Haraguchi | H01J 37/304 250/492.22 |
| 2006/0076508 A1* | 4/2006 | Nakasugi | B82Y 10/00 250/491.1 |
| 2007/0023689 A1* | 2/2007 | Iizuka | B82Y 10/00 250/492.22 |

(Continued)

FOREIGN PATENT DOCUMENTS

| JP | 61-15325 | 1/1986 |
| JP | 62-183514 | 8/1987 |

(Continued)

*Primary Examiner* — Jason L McCormack
(74) *Attorney, Agent, or Firm* — Oblon, McClelland, Maier & Neustadt, L.L.P.

(57) ABSTRACT

In one embodiment, a charged particle beam lithography apparatus includes an irradiator 201 to irradiate substrates with charged particle beams, each of the substrates being provided with a predetermined mark, and a detector 114 to detect charged particles emitted when the predetermined mark is scanned by a charged particle beam and output a detection signal. The apparatus further includes an amplifier 124 to adjust and amplify the detection signal and output an amplified signal, and a measurement circuitry 211 to measure a location of the predetermined mark based on the amplified signal. The apparatus further includes storage 128 to store initial gain values of the amplifier for amplifying the detection signal, the initial gain values corresponding to conditions of the scan. The amplifier amplifies the detection signal based on an initial gain value selected from the initial gain values according to a condition of the scan.

5 Claims, 6 Drawing Sheets

(56) References Cited

U.S. PATENT DOCUMENTS

2014/0288912 A1* 9/2014 Inoue ..................... H04L 67/12
                                                        703/14

FOREIGN PATENT DOCUMENTS

| JP | 62-208628 | 9/1987 |
| JP | 6-326013 | 11/1994 |
| JP | 2003-86792 | 3/2003 |
| JP | 2004-280287 | 10/2004 |
| JP | 2005-210444 | 8/2005 |
| TW | 201245707 A1 | 11/2012 |

* cited by examiner

CHARGED PARTICLE BEAM LITHOGRAPHY APPARATUS AND CHARGED PARTICLE BEAM LITHOGRAPHY METHOD

CROSS REFERENCE TO RELATED APPLICATION

This application is based upon and claims the benefit of priority from the prior Japanese Patent Application No. 2017-003495, filed on Jan. 12, 2017, the entire contents of which are incorporated herein by reference.

FIELD

Embodiments described herein relate to a charged particle beam lithography apparatus and a charged particle beam lithography method such as a method of detecting an alignment mark formed on a substrate.

BACKGROUND

Together with the increase in integration of semiconductor devices, the circuit width line required for the semiconductor devices has grown smaller year by year. In order to form a desired circuit pattern on a semiconductor device, a high-precision original image pattern is required. Accordingly, the electron beam lithography technique has inherently excellent resolution, and is used for production of original patterns with a high degree of accuracy.

FIG. 6 is a conceptual diagram illustrating the operation of a conventional electron beam lithography apparatus, and illustrates an example of variable shape electron beam lithography apparatuses.

In a first aperture 320, a rectangular opening 321 for producing an electron beam 300 is formed. In addition, a variable shaping aperture 331 for shaping the electron beam 300 passed through the opening 321 of the first aperture 320 into a desired rectangular shape is formed in a second aperture 330.

A sample 301 is placed on a stage that is continuously movable in a predetermined direction (for example, the X direction). The electron beam 300 emitted from an electron gun 310 and passed through the opening 321 of the first aperture 320 is deflected by the deflector and passed through a portion of the variable shaping aperture 331 of the second aperture 330 to irradiate the sample 301. That is, the electron beam 300 capable of passing through both the opening 321 of the first aperture 320 as well as the variable shaping aperture 331 of the second aperture 330 is formed, for example, into a rectangular shape, and, as a result, a rectangular shape is rendered on the drawing region (lithography region) of the sample 301. Such a method of rendering an arbitrary shape by passing the electron beam 300 through both the opening 321 of the first aperture 320 and the variable shaping aperture 331 of the second aperture 330 is referred to as a variable shaping method.

Together with the recent miniaturization of circuit patterns, there is a demand for improvement in the resolution of photolithography. One method to cope with this demand is a phase-shifting method in which photolithography is performed using a phase shifting mask. The above-described electron beam lithography apparatus can be used, for example, to manufacture a phase shifting mask (PSM) substrate for a phase shifting mask. In this case, an example of the sample 301 is a substrate to be processed for manufacturing a PSM substrate, and includes, for example, a glass substrate and one or more layers formed on the glass substrate.

As the phase shifting mask requires both a shading layer pattern and a half-tone layer pattern, the alignment (alignment accuracy) when superimposing these two patterns may become problematic. For example, a method is employed in which when a first layer pattern is formed, alignment marks are created on the shading layer and the half-tone layer, and when a second layer pattern is formed, the drawing position of the second layer pattern is adjusted based on the position of the alignment marks.

At this time, as it is difficult to arrange the alignment marks within the actual pattern (main pattern) of the first layer, it is generally arranged around the main pattern. In this way, the alignment marks are often arranged in the vicinity of or outside the boundary location of the lithography accuracy compensation region of the substrate (substrate to be processed). Therefore, there is a high probability that the positional accuracy of the alignment marks is inferior in comparison to those of the main pattern.

DETAILED DESCRIPTION

Figure 1:
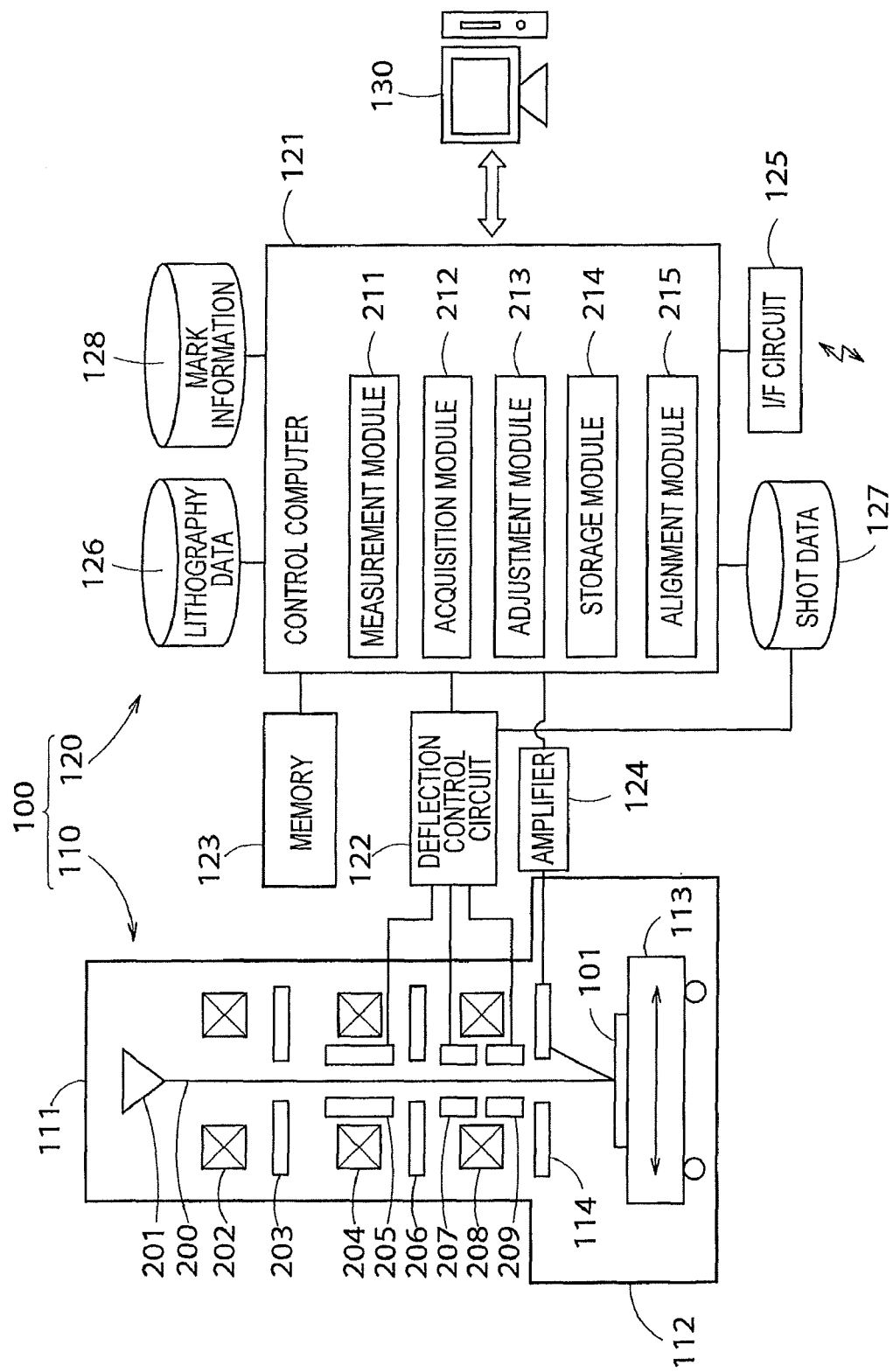
FIG. 1 is a schematic diagram illustrating a configuration of an electron beam lithography apparatus of a first embodiment.

Embodiments will now be explained with reference to the accompanying drawings.

In general, the electron beam lithography apparatuses described above has an alignment lithography function for measuring the location of alignment marks (hereinafter, also simply referred to as "marks") with an electron beam scan, and drawing a pattern on a substrate using the location of the marks as a reference. The alignment lithography function has been primarily used for manufacturing PSM substrates.

Typically, an alignment mark location measurement process includes adjustment of an amplifier for mark detection, a search scan for scanning a wide range of a substrate to detect one or more marks, and a measurement scan to precisely measure the center of the mark. When adjusting the amplifier, an alignment mark is scanned, an amplification factor (gain) of the amplifier and a reference signal (level) are acquired based on the contrast between the alignment mark and the base, and the amplification factor of the amplifier and the reference signal are adjusted. However, the mark location on the substrate provided on the stage of the electron beam lithography apparatus varies depending on the accuracy with which the substrate is loaded. Accordingly, it can be difficult to ensure obtaining the amplification factor for the amplifier using the first adjustment scan of the amplifier to scan the alignment mark.

In addition, there is a demand in recent years for an alignment lithography function for manufacturing extreme ultra violet (EUV) substrates. As PSM substrates and EUV substrates are made from different materials, the amplification factors of amplifiers when these substrates are used also differ from one another, respectively. As such, in order to handle both PSM substrates and EUV substrates with the same electron beam lithography apparatus, it is necessary to set amplification factors matching the respective alignment mark signals.

In one embodiment, a charged particle beam lithography apparatus includes an irradiator configured to irradiate a plurality of substrates with charged particle beams, each of the substrates being provided with a predetermined mark, and a detector configured to detect charged particles emitted when the predetermined mark is scanned by a charged particle beam and output a detection signal. The apparatus further includes an amplifier configured to adjust and amplify the detection signal and output an amplified signal, and a measurement circuitry configured to measure a location of the predetermined mark based on the amplified signal. The apparatus further includes storage configured to store initial gain values of the amplifier for amplifying the detection signal, the initial gain values corresponding to conditions of the scan. The amplifier amplifies the detection signal based on an initial gain value selected from the initial gain values according to a condition of the scan.

In another embodiment, a charged particle beam lithography method includes irradiating a substrate with a charged particle beam, the substrate being provided with a predetermined mark, and detecting charged particles emitted from the substrate when the substrate is scanned by the charged particle beam and outputting a detection signal. The method further includes selecting an initial gain value with respect to the detection signal from a plurality of initial gain values corresponding to conditions of the scan, amplifying the detection signal based on the selected initial gain value, and outputting an amplified signal, and measuring a location of the predetermined mark based on the amplified signal.

(First Embodiment)

FIG. 1 is a schematic diagram illustrating a configuration of an electron beam lithography apparatus 100 according to the first embodiment. In FIG. 1, the electron beam lithography apparatus 100, which is an exemplary charged particle beam lithography apparatus, includes a lithography module 110 and a control module 120.

The lithography module 110 includes an electron lens barrel 111, a lithography chamber 112, an XY stage 113, and a detector 114. Within the electron lens barrel 111, an electron gun 201, an illumination lens 202, a first aperture 203, a projection lens 204, a deflector 205, a second aperture 206, a deflector 207, an objective lens 208, and a deflector 209 are included. The electron gun 201 is one example of an irradiator.

Further, the control module 120 includes a control computer 121, a deflection control circuit 122, a memory 123, an amplifier 124, an Interface (I/F) circuit 125, and memories 126, 127, and 128. The memory 128 is one example of the storage. The control computer 121 may be configured to function as a measurement module 211, an acquisition module 212, an adjustment module 213, a storage module 214, and an alignment module 215 by executing predetermined program processing operations. Further, the control computer 121 is capable of communicating with a personal computer (PC) 130 connected to the electron beam lithography apparatus 100 via a network. The measurement module 211, the adjustment module 213 and the alignment module 215 are examples of a measurement circuitry, an adjuster and an alignment circuitry, respectively.

An electron beam 200 emitted from the electron gun 201 illuminates, by means of the illumination lens 202, the entirety of the first aperture 203 having the rectangular opening. In this way, the electron beam 200 is first shaped into a rectangle. The electron beam 200 is one example of a charged particle beam.

After passing through the first aperture 203, the electron beam 200 having the first aperture image is projected onto the second aperture 206 having the variable shaping aperture by means of the projection lens 204. The location of the first aperture image on the second aperture 206 is controlled by the deflector 205. The second aperture 206 may be configured to adjust the beam shape and size of the electron beam 200.

After passing through the second aperture 206, the electron beam 200 having the second aperture image is focused by the objective lens 208 and deflected by the deflectors 207 and 209. Subsequently, the electron beam 200 is directed onto the substrate 101 on the XY stage 113 that is movably disposed in the lithography chamber 112. One example of the substrate 101 is a substrate to be processed that is used for producing a PSM substrate or an EUV substrate, and includes, for example, a glass substrate with one or more glass layers formed thereon.

The deflectors 205, 207, and 209 are controlled by the control computer 121 via the deflection control circuit 122, and are used for controlling the trajectory of the electron beam 200. The control computer 121 can scan the substrate 101 with the electron beam 200 by controlling the trajectory of the electron beam 200. Input/output data such as the results obtained by the calculation of the control computer 121 is stored in the memory 123.

When the substrate 101 is scanned with the electron beam 200, electrons are emitted from the substrate 101. When this occurs, the detector 114 detects the electrons and outputs a detection signal. Further, the amplifier 124 amplifies the detection signal and outputs an amplified signal. The amplified signal is input to the control computer 121, and used to detect the alignment marks or the like.

In addition, the I/F circuit 125 is utilized for communication with external devices such as the PC 130. Lithography data, shot data, and mark information are stored in each of the memories 126, 127, and 128. Examples of the mark information include initial values to be used for detecting alignment marks, location information for the alignment marks, and the like.

The electron beam lithography apparatus 100 of the present embodiment has an alignment lithography function for measuring the location of the alignment marks formed on the substrate 101 by electron beam scanning and drawing a pattern on the substrate 101 with reference to the mark location. Control of the electron beam lithography apparatus 100 and the various arithmetic processes necessary for this function are executed by the control computer 121. Hereinafter, an exemplary processing by the alignment lithography function of the present embodiment will be described.

First, the substrate 101 is placed on the XY stage 113. Next, the XY stage 113 is moved to adjust its position such that the substrate 101 is irradiated with the electron beam 200.

Next, prior to the search scan described later, the amplification factor (hereinafter referred to as "gain") and offset reference signal (hereinafter referred to as "level") of the amplifier 124 are acquired. In particular, in the detection signal amplification step, initial values of the gain and level of the amplified signal with respect to the detection signal are acquired from the memory 128, and the substrate 101 is scanned and a level value is obtained. Hereinafter, the initial value of the gain is also referred to as "initial gain value", and the initial value of the level is also referred to as "initial level value."

Next, in order to detect the alignment mark, a wide range of the substrate 101 is scanned with the electron beam 200 (e.g., search scan). As a result, electrons emitted from the substrate 101 are detected by the detector 114, and a detection signal is output. Further, the amplifier 124 amplifies the detection signal based on the initial value of the gain, and outputs the amplified signal in accordance with the initial value of the level. Based on this amplified signal, the control computer 121 detects one or more alignment marks formed on the substrate 101.

In the event that the search scan is successful, a measurement scan is performed to precisely measure the center of the detected alignment mark(s). More particularly, the adjustment module 213 can adjust the values of the gain and level and perform an electron beam scan, and measure the location of the alignment marks based on the amplified signal obtained by amplifying and adjusting the detection signal with the adjusted gain and level.

In the event that the location of the alignment marks are successfully measured, the final gain and level values are updated as new initial gain and level values and stored in the memory 128. In particular, the initial values used in the current search scan are updated to the new initial values. The new initial values stored within the memory 128 are acquired from the memory 128 and used in subsequent search scans.

Meanwhile, the measurement result indicating the location of the alignment marks is used for alignment between the patterns of the substrate 101. As an example, when the second layer pattern is drawn on the PSM substrate, the measurement result indicating the location of the alignment mark(s) is used to align the pattern of the first layer and the pattern of the second layer. In particular, the irradiation location of the electron beam 200 at the time of drawing, the second layer pattern is controlled based on the position of the alignment mark(s). A detailed example of this process will be described later with reference to FIGS. 2A to 5.

As described above, the alignment marks of the present embodiment are detected by the search scan, and their locations are measured by the scan. In order to complete these steps in a reduced time period, improving the mark detection accuracy of the search scan, or decreasing the number of search scan failures can be considered.

Accordingly, in the present embodiment, initial values corresponding to particular scan conditions previously stored in the memory 128 are used as the gain and level values at the time of the search scan. In this way, it is possible to improve the mark detection accuracy of the search scan by previously storing a suitable value as an initial value. Furthermore, after successful measuring of the location of alignment marks, by updating the initial values with the values of the gain and level corresponding to the successful scan, it becomes possible to reuse recent suitable values as the initial values.

As described above, examples of the substrate 101 include substrates to be processed for manufacturing PSM substrates or EUV substrates. In such a case, as PSM substrates and EUV substrates are made from different materials and have differing structures, the scan conditions for each are also different. In other words, suitable gain and level values for search scans differ between PSM substrates and EUV substrates. Accordingly, in the present embodiment, this challenge is addressed by distinguishing initial gain and level values for PSM substrates and initial gain and level values for EUV substrates, respectively.

More particularly, a plurality of files for different scan conditions are stored in the memory 128 of the present embodiment; for example, a PSM file for storing PSM substrate data and a EUV file for storing EUV substrate data. Accordingly, initial gain and level values for PSM substrates are stored in the PSM file, and initial gain and level values for EUV substrates are stored in the EUV file. The PSM substrate, EUV substrate, PSM file, and EUV file are examples of the first substrate, the second substrate, the first file, and the second file, respectively.

In the present embodiment, when the substrate 101 is a PSM substrate, initial gain and level values are acquired from the PSM file, and a search scan is performed using these initial values. In addition, new initial values obtained from the subsequent measurement scan are stored in the PSM file. In the same way, when the substrate 101 is an EUV substrate, initial gain and level values are acquired from the EUV file, and a search scan is performed using these initial values. In addition, new initial values acquired from subsequent measurement scans are stored in the EUV file. A detailed example of this process will be described later with reference to FIGS. 2A to 5.

Figure 2A:
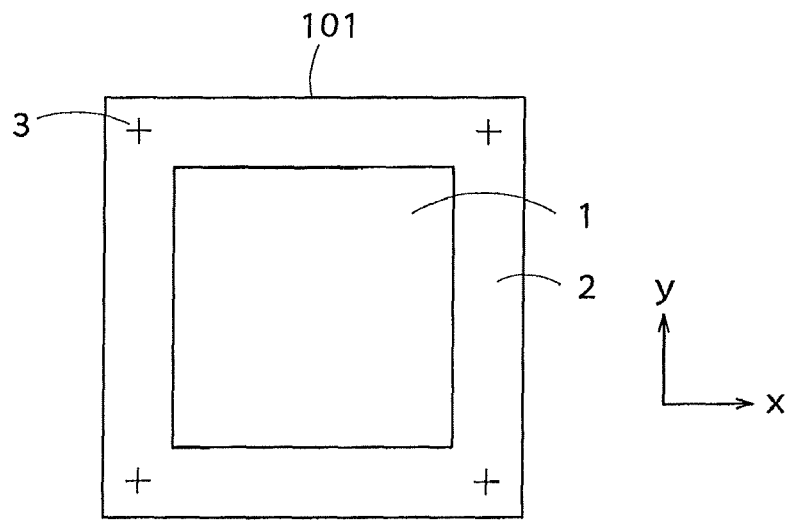
FIGS. 2A and 2B are plan views illustrating examples of a PSM substrate and an EUV substrate of the first embodiment.
Figure 2B:
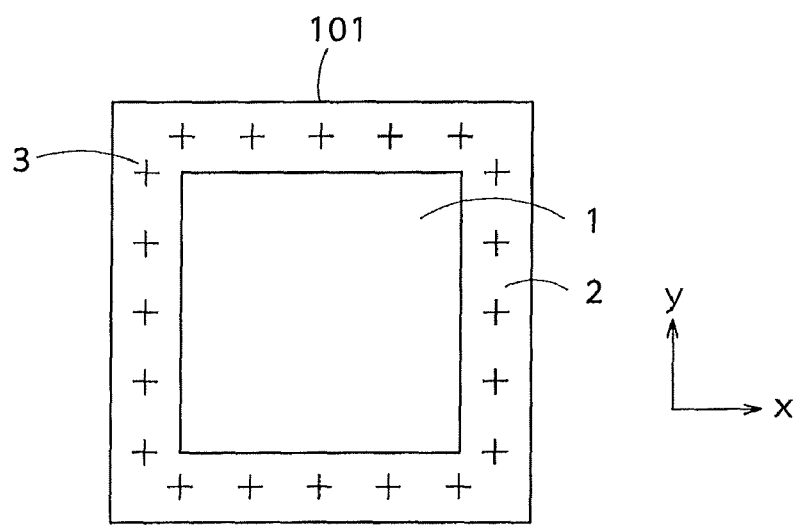

FIGS. 2A and 2B are plan views illustrating examples of a PSM substrate and an EUV substrate of the first embodiment.

FIG. 2A illustrates the EUV substrate manufactured from the substrate 101, and FIG. 2B illustrates the PSM substrate manufactured from the substrate 101. These substrates include an actual pattern (main pattern) region 1 and an alignment mark region 2 provided around the actual pattern region 1. A plurality of alignment marks 3 are provided in the alignment mark region 2.

Although the EUV substrate of FIG. 2A is depicted as having four alignment marks 3 at its four corners, the number and arrangement of the alignment marks 3 are not limited thereto. Likewise, although the PSM substrate of FIG. 2B is depicted as having many alignment marks 3 on each side, the number and arrangement of the alignment marks 3 are not limited thereto. Besides, although the alignment marks 3 in FIGS. 2A and 2B are formed in a cross shape, other shapes are also possible.

In the following, a process of manufacturing PSM and EUV substrates from the substrate 101 will be described with the PSM substrate taken as an example. However, the following method is also generally applicable when manufacturing EUV substrates.

FIGS. 3A to 4C are cross-sectional views illustrating an example of a method of manufacturing the PSM substrate of the first embodiment.

Figure 3A:
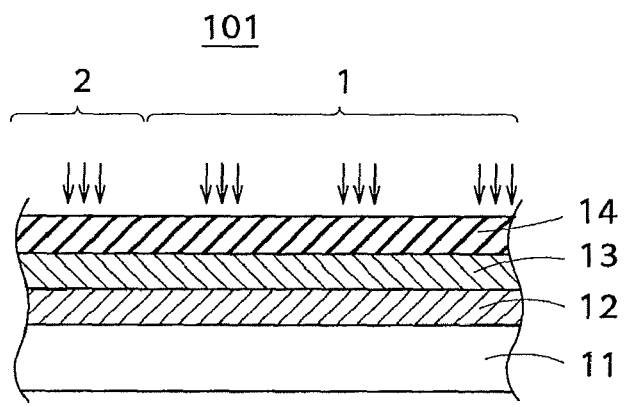
FIGS. 3A to 4C are cross-sectional views illustrating an example of a method of manufacturing the PSM substrate of the first embodiment.

FIG. 3A illustrates a substrate 101 (substrate to be processed) for manufacturing a PSM substrate in which a half-tone layer 12, a shading layer 13, and a resist film 14 are sequentially formed on top of a glass substrate 11. As an example of the half-tone layer 12, a molybdenum silicide (MoSi) layer is used. As an example of the shading layer 13, a chromium (Cr) layer is used.

First, the substrate 101 is loaded into the electron beam lithography apparatus 100, and the pattern of the first layer is drawn on the resist film 14 by the electron beam 200 (FIG. 3A). At this time, the pattern of the first layer is drawn on the resist film 14 in the actual pattern region 1, and the pattern for the alignment marks 3 is drawn on the resist film 14 in the alignment mark region 2.

Figure 3B:
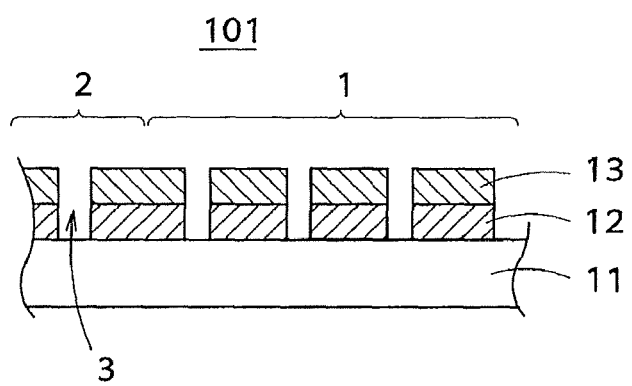

Next, the substrate 101 is removed from the electron beam lithography apparatus 100, the resist film 14 is developed, and the shading layer 13 and the half-tone layer 12 are etched using the resist film 14 as a mask (FIG. 3B). As a result, the pattern of the first layer is formed in the shading layer 13, and the half-tone layer 12 is formed in the actual pattern region 1. In addition, one or more alignment marks 3 are formed in the shading layer 13 and the half-tone layer 12 in the alignment mark region 2.

Figure 3C:
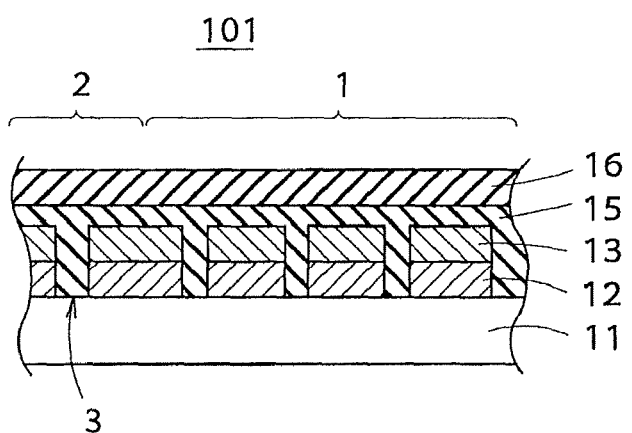

Next, a resist film 15 and an antistatic film 16 are sequentially formed on top of the glass substrate 11 via the half-tone layer 12 and the shading layer 13 (FIG. 3C).

Figure 4A:
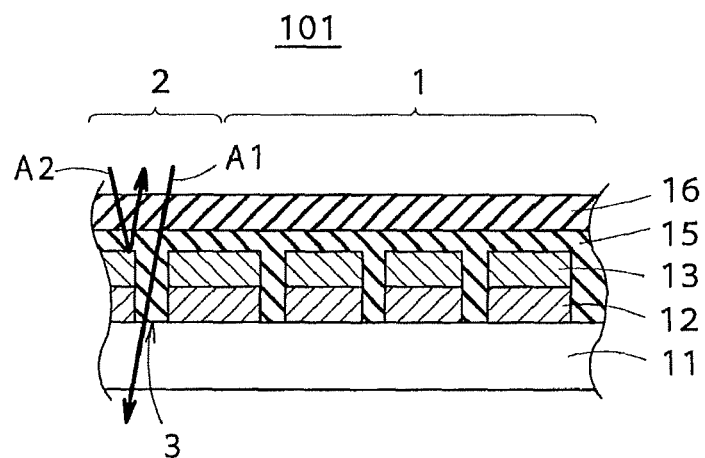
Figure 4B:
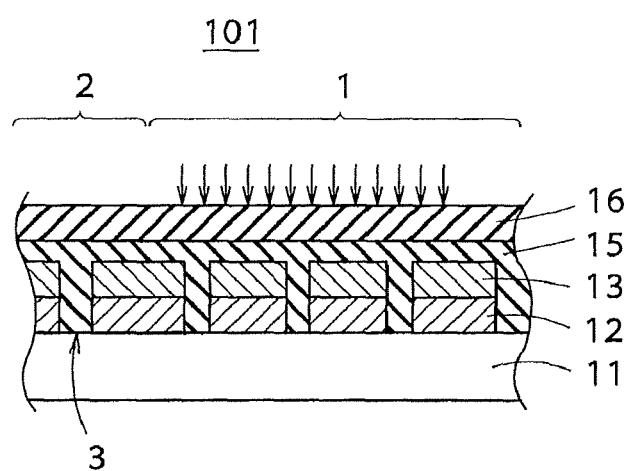

Next, the substrate 101 is loaded into the electron beam lithography apparatus 100, initial values for the PSM substrate are acquired from the PSM file, and a search scan is performed using the initial values (FIG. 4A). That is, a wide range of the substrate 101 is scanned with the electron beam 200. At this time, the electron beam 200 incident on the shading layer 13 in the alignment mark region 2 is, as indicated by arrows A1 and A2, either reflected by the shading layer 13 or passed through the alignment mark 3. As a result, it becomes possible to detect the alignment mark 3 from the electrons arriving from the substrate 101. The control computer 121 detects the alignment mark 3 using the amplified signal from the amplifier 124.

Next, after measurement of the location of the alignment mark 3 with the measurement scan, the second layer pattern is drawn on the resist film 15 using the electron beam 200 (4B). At this time, the measurement result for the location of the alignment mark 3 is used to align the locations of the first layer pattern and the second layer pattern. The final adjusted gain and level values of the measurement scan are stored in the PSM file as new initial values for PSM substrates.

Figure 4C:
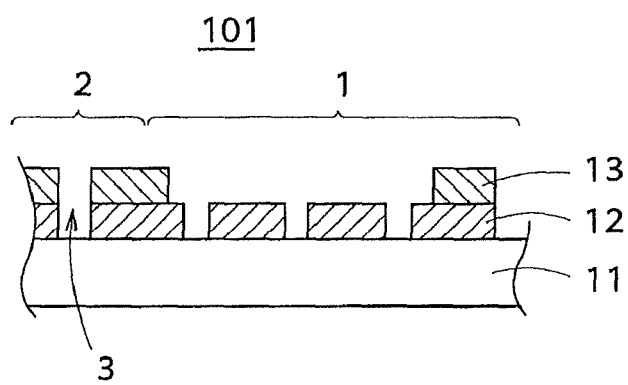

Next, the substrate 101 is removed from the electron beam lithography apparatus 100, the resist film 15 is developed, and the shading layer 13 is etched using the resist film 15 as a mask (FIG. 4C). As a result, the second layer pattern is formed in the shading layer 13 within the actual pattern region 1.

Subsequently, various processes are performed on the substrate 101. In this way, a PSM substrate is manufactured from the substrate 101.

Figure 5:
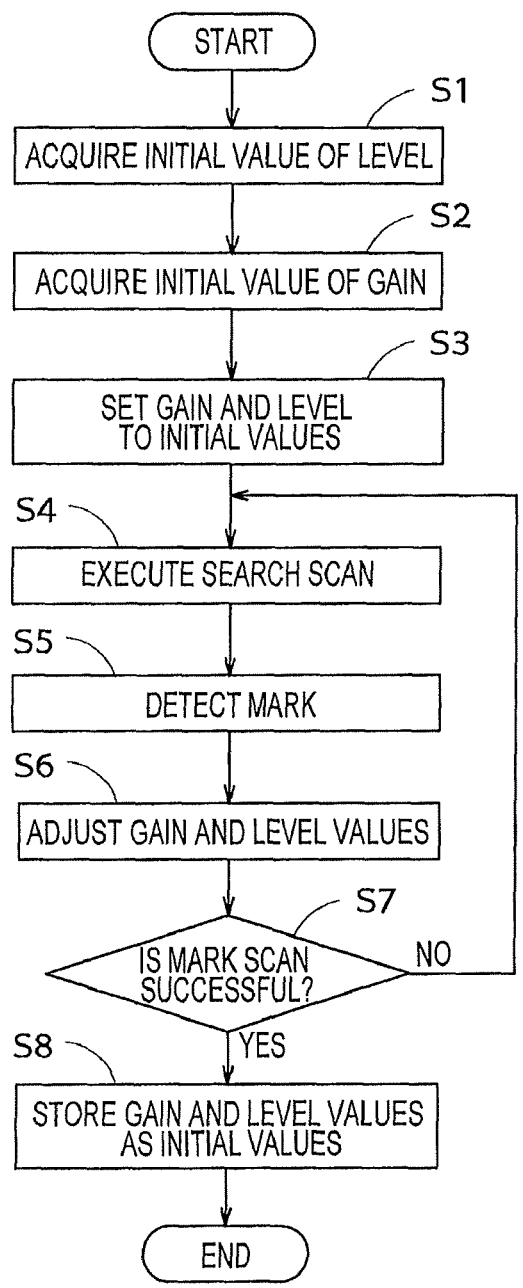
FIG. 5 is a flowchart illustrating an electron beam lithography method of the first embodiment.
Figure 6:
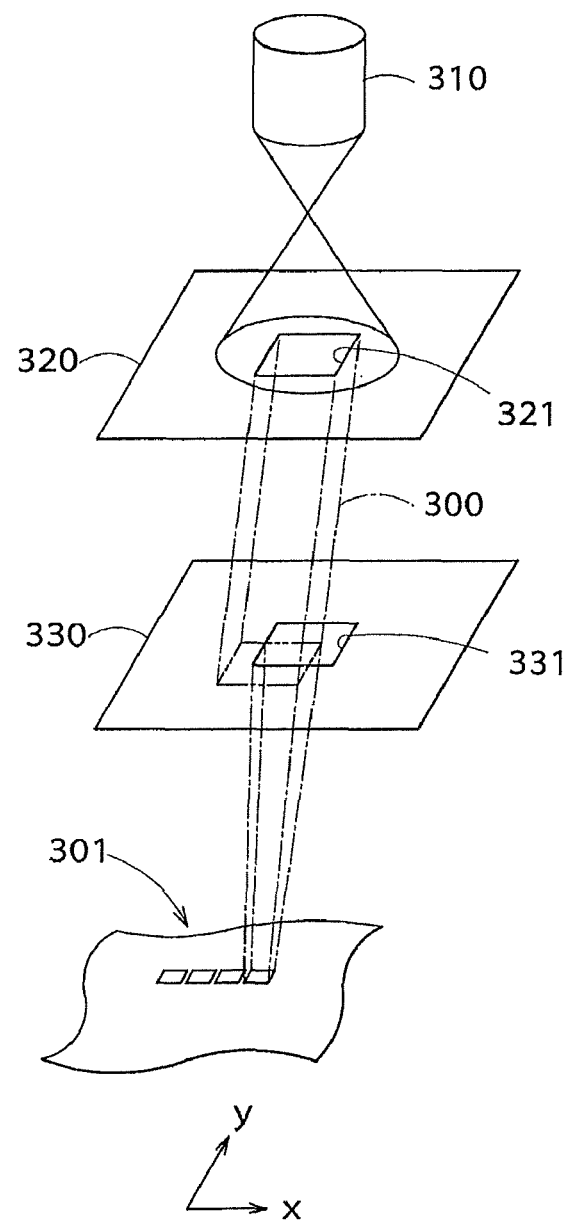
FIG. 6 is a conceptual diagram illustrating an operation of a conventional electron beam lithography apparatus.

FIG. 5 is a flowchart illustrating an electron beam lithography method of the first embodiment. FIG. 5 illustrates an exemplary alignment mark location measurement process when a pattern is drawn on the substrate 101 on which the alignment marks are formed, and corresponds to the step shown in FIG. 4A.

First, with respect to the substrate 101 placed on the XY stage 113, an initial value for the level and an initial value for the gain are acquired from the memory 128 (steps S1 and S2). At this time, when processing the substrate 101 into a PSM substrate, initial values are acquired from the PSM file, and when processing the substrate 101 into an EUV substrate, initial values are acquired from the EUV file. In the present embodiment, a user of the PC 130 selects the type of substrate 101 as a PSM substrate or a EUV substrate on the screen of the PC 130. The control computer 121 is notified of the selection result from the PC 130, and the control computer 121 acquires initial values from the corresponding file based on the selection result.

Next, the gain and level are set to the initial values (Step S3), and a search scan of the substrate 101 is executed using this setting (Step S4). Accordingly, when an alignment mark is detected (Step S5), a measurement scan is initiated.

In particular, the gain and level values are adjusted, an electron beam scan is performed in the vicinity of the alignment mark(s), and by detecting one or more alignment marks using the adjusted gain and level, the center of the mark is accurately measured (Step S6). As a result, when the location measurement of the alignment marks is successful (step S7), the adjusted gain and level values are saved as new initial values (Step S8). Subsequently, the first layer and second layer patterns are aligned, and the second layer pattern is drawn based on the position of the alignment marks. Alternatively, if location measurement of the alignment marks fails, the process returns to step S4.

In the present embodiment, three or more layers of patterns may be drawn on the substrate 101. In such a case, when each pattern including and subsequent to the third layer pattern is drawn, the processing steps of S1 to S8 are performed. For example, when the third layer pattern is drawn, the initial gain and level values stored when the second layer was drawn is used.

The details of the initial gain and level values will now be described.

As described above, since the PSM substrate and the EUV substrate differ in terms of material and structure, suitable gain and level values for the search scan also differ between the PSM substrate and the EUV substrate. For example, the material and film thickness of the shading layer 13 may be different between different types of substrates. As such, in the present embodiment, the initial values of the gain and level are differentiated between those for the PSM substrate and those for the EUV substrate.

This holds true for different PSM substrates and for different EUV substrates. For example, there are cases when suitable gain and level values for one PSM substrate are different than suitable gain and level values for another PSM substrate. Accordingly, in the present embodiment, two or more types of PSM files may be stored in the memory 128, and different initial values may be stored in each different PSM file. In such a case, the user of the PC 130 selects one type of PSM substrate from among a plurality of types of PSM substrates presented on the screen of the PC 130. This is also applicable to the EUV substrate.

In addition, as described above, the initial values in the PSM file and the EUV file are updated after the measurement scan. At this time, the update of the initial values may be automatically initiated, or the initial values may be updated only when permitted by the user of the PC 130. Further, updating of the initial values may be performed such that old initial values are overdrawn by new initial values, or new initial values are saved while retaining the old initial values. In the latter case, it may also be possible for the user to return the new initial values to the old initial values.

In addition, at the time of factory shipment of the electron beam lithography apparatus 100, it is conceivable to store PSM files or EUV files in which initial gain and level values adjusted by the manufacturer are stored in the memory 128. In this case, the initial values adjusted by the manufacturer may be used until the first update of the initial values. Alternatively, it may be possible that the initial values are not stored in the electron beam lithography apparatus 100 at the time of factory shipment, but instead the user sets the initial values. Further, it may also be possible that PSM files and EUV files are not stored in the electron beam lithography apparatus 100 at the time of factory shipment, but instead the user creates PSM and EUV files.

Further, in the present embodiment, although different files are created for the respective PSM substrate and EUV substrate, it is also possible to create various files according to other conditions.

As described above, the electron beam lithography apparatus 100 of the present embodiment uses initial values stored in the memory 128 in advance as the values of the gain and level when performing a search scan. In this way, by storing suitable values as the initial values in advance, it is possible to improve mark detection accuracy of the search scan.

In addition, the electron beam lithography apparatus 100 of the present embodiment is configured to update even if the performance of the irradiator (electron gun 201) and the detector 114 in the electron beam lithography apparatus 100 decreases with age the initial gain and level values with the gain and level values used to successfully measure the location of the alignment marks. In this way, it becomes possible to reuse recent suitable values as the initial values. Accordingly, it is possible to update the initial values to suitable values corresponding to the degree of the deterioration.

In this way, it is possible to improve the mark detection accuracy at the time of detecting the alignment marks formed on the substrate 101 by electron beam scanning according to the present embodiment.

In the electron beam lithography apparatus 100 of the present embodiment, multiple beams may be used as the electron beam 200. The alignment lithography function of the present embodiment may also be applicable in the case where multiple beams are used. Further, the electron beam 200 may be replaced with another charged particle beam, such as an ion beam.

While certain embodiments have been described, these embodiments have been presented by way of example only, and are not intended to limit the scope of the inventions. Indeed, the novel apparatuses and methods described herein may be embodied in a variety of other forms; furthermore, various omissions, substitutions and changes in the form of the apparatuses and methods described herein may be made without departing from the spirit of the inventions. The accompanying claims and their equivalents are intended to cover such forms or modifications as would fall within the scope and spirit of the inventions.

The invention claimed is:

1. A charged particle beam lithography apparatus comprising:
   an irradiator configured to irradiate a plurality of substrates with charged particle beams, each of the substrates being provided with a predetermined mark;
   a detector configured to detect charged particles emitted when the predetermined mark is scanned by a charged particle beam and output a detection signal;
   an amplifier configured to adjust and amplify the detection signal and output an amplified signal;
   a measurement circuitry configured to measure a location of the predetermined mark based on the amplified signal;
   a storage configured to store initial gain values of the amplifier for amplifying the detection signal and store initial level values of the amplifier for adjusting the detection signal, the initial gain values and the initial level values corresponding to conditions of the scan; and
   an adjuster configured to adjust a gain value and a level value of the amplifier,
   wherein
   the amplifier amplifies and adjusts the detection signal based on an initial gain value and an initial level value that are selected from the initial gain values and the initial level values according to a condition of the scan, and
   the initial gain value and the initial level value are updated as a new initial gain value and a new initial level value in the storage based on a gain value and a level value used by the measurement circuitry to measure the location of the predetermined mark successfully.

2. The apparatus of claim 1, wherein
   the plurality of substrates includes a first substrate and a second substrate; and
   the storage includes a first file to store the initial gain value and the initial level value to be used when the first substrate is scanned, and a second file to store the initial gain value and the initial level value to be used when the second substrate is scanned.

3. The charged particle beam lithography apparatus of claim 1, further comprising an alignment circuitry configured to control an irradiation location of the charged particle beam when a pattern is drawn on a substrate based on the location of the predetermined mark measured by the measurement circuitry.

4. A charged particle beam lithography method comprising:
   irradiating a substrate with a charged particle beam, the substrate being provided with a predetermined mark;
   detecting charged particles emitted from the substrate when the substrate is scanned by the charged particle beam and outputting a detection signal;
   selecting an initial gain value with respect to the detection signal from a plurality of initial gain values corresponding to conditions of the scan;
   selecting an initial level value from a plurality of initial level values of the amplifier for adjusting the detection signal, the plurality of initial level values corresponding to conditions of the scan;
   amplifying and adjusting the detection signal based on the selected initial gain value and the selected initial level value;
   outputting an amplified signal; and
   measuring a location of the predetermined mark based on the amplified signal,
   wherein the initial gain value and the initial level value are updated as a new initial gain value and a new initial level value based on a gain value and a level value used to measure the location of the predetermined mark successfully.

5. The method of claim 4, further comprising aligning, based on the measured location of the predetermined mark, an irradiation location of the charged particle beam when a pattern is drawn on the substrate.

* * * * *